US007724102B2

(12) United States Patent
Ullmann

(10) Patent No.: US 7,724,102 B2
(45) Date of Patent: May 25, 2010

(54) OSCILLATOR CIRCUIT

(75) Inventor: Igor Ullmann, Villach (AT)

(73) Assignee: Infineon Technologies AG, Neubiberg (DE)

( * ) Notice: Subject to any disclaimer, the term of this patent is extended or adjusted under 35 U.S.C. 154(b) by 159 days.

(21) Appl. No.: 11/861,292

(22) Filed: Sep. 26, 2007

(65) Prior Publication Data

US 2008/0079507 A1 Apr. 3, 2008

(30) Foreign Application Priority Data

Sep. 29, 2006 (DE) ....................... 10 2006 046 189

(51) Int. Cl.
*H03B 5/12* (2006.01)

(52) U.S. Cl. ............ 331/117 R; 331/36 L; 331/117 FE; 331/167; 331/177 V

(58) Field of Classification Search ........... 331/117 FE, 331/117 R, 167, 177 V, 36 L
See application file for complete search history.

(56) References Cited

U.S. PATENT DOCUMENTS 6,127,900 A * 10/2000 Laub et al. .................. 331/179
6,906,596 B2 * 6/2005 Kitamura et al. .......... 331/36 C
6,954,088 B2 10/2005 Masenas
2004/0196110 A1 10/2004 Boccuzzi et al.
2006/0181362 A1 * 8/2006 Ikuta et al. .................. 331/167

FOREIGN PATENT DOCUMENTS

DE 102004020975 A1 11/2005

OTHER PUBLICATIONS

Ping Wing Lai et al; A 2.4GHz SiGe Low Phase-Noise VCO Using On Chip Tapped inductor; 2003 IEEE; pp. 505-508; 0-7803-8108-4/03.

Marc Tiebout et al.; A 1V 51GHz Fully-Integrated VCO in 0.12 µm CMOS; ISSCC 2002 Visuals Supplement/IEEE; pp. 238-239.

Marc Tiebout; Low-Power Low-Phase-Noise Differentially Tuned Quadrature VCO Design in Standard CMOS; IEEE Journal of Solid-State Circuits; pp. 1018-1024; vol. 36, No. 7, Jul. 2001.

* cited by examiner

*Primary Examiner*—Robert Pascal
*Assistant Examiner*—Levi Gannon
(74) *Attorney, Agent, or Firm*—SpryIP, LLC

(57) ABSTRACT

An apparatus described herein is an LC tank circuit that may include a capacitance, a first inductance, and a second inductance. The first inductance and the second inductance may each be center tapped coils.

11 Claims, 3 Drawing Sheets

OSCILLATOR CIRCUIT

RELATED APPLICATION INFORMATION

This application claims priority to German Patent Application DE 10 2006 046 189.4 filed on Sep. 29, 2006. The entire contents of the German Patent Application are hereby incorporated herein by reference.

BACKGROUND

There are various types of oscillator circuits. Depending on the field of application, an oscillator may be required to have certain operational parameters, such as low power consumption, low phase noise, high oscillation frequency, wide oscillation frequency adjustment range, low sensitivity to interference signals and/or low manufacturing cost. By way of example, some LC oscillators, which include frequency determining components such as inductors and capacitors, achieve a number of the above-listed parameters.

An LC oscillator circuit whose oscillation frequency can be adjusted by application of a tuning voltage may be referred to as a voltage controlled oscillator (VCO). One possible way to control the frequency of such an LC oscillator is to use one or more so-called varactors. Varactors include capacitive components that may be tuned by way of an applied voltage. Varying the capacitance value of the capacitive components determines the oscillation frequency of the LC oscillator.

BRIEF DESCRIPTION OF THE DRAWINGS

The detailed description is described with reference to the accompanying figures. The use of identical or similar reference numbers in different figures indicates identical or similar items.

DETAILED DESCRIPTION

Figure 1:
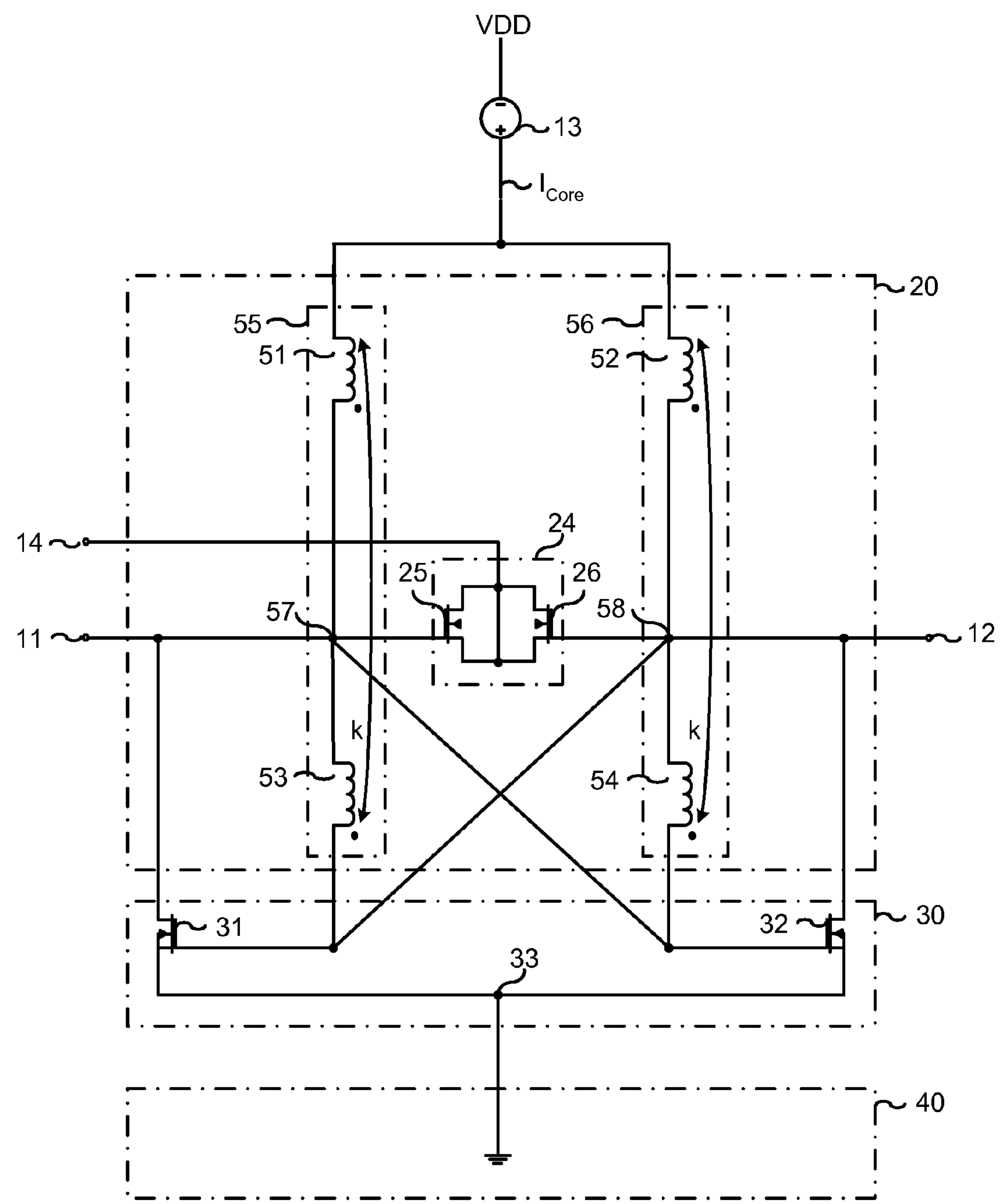
FIG. 1 illustrates a schematic circuit diagram of an oscillator circuit.

FIG. 1 illustrates a schematic circuit diagram of an oscillator circuit in accordance with an implementation described herein. The voltage controlled oscillator is designed symmetrically and includes an LC tank circuit 20 that includes inductances 55, 56 and a capacitance 24.

The capacitance 24 has a capacitance value C and may be adjusted by way of a tuning voltage $V_{tune}$ 14, which may be applied to a tuning voltage terminal. The capacitance value C may be varied by using the tuning voltage $V_{tune}$ to vary the capacitance of auxiliary transistors 25, 26, which act as varactors. The auxiliary transistors 25, 26 may be MOS transistors, and the voltage dependent capacitance may be formed between the gate and the substrate (that is to say between the drain and source terminals).

There may be a plurality of varactors and the total capacitance, and therefore the oscillation frequency of the oscillator circuit, may be varied by way of the tuning voltage $V_{tune}$ 14.

The tuning voltage $V_{tune}$ 14 may be adjusted in discrete steps. In the case of a digitally controlled oscillator (DCO), the tuning voltage $V_{tune}$ 14 may be obtained from a digital control word and a corresponding decoding circuit, for example a digital-to-analog converter.

In one implementation the tuning voltage $V_{tune}$ 14 may be adjusted in an analog manner. In another implementation the tuning voltage $V_{tune}$ 14 may be produced by a combination of digital and analog controls.

Both the inductance 55 and the inductance 56 may be a center tapped coil. Each center tapped coil may have an inductance value L/2. Alternatively the inductances 55, 56 may include separate coils.

However, center tapped coils may be superior to separate coils in terms of injections of interferences, for example from a reference current source 13. Therefore, center tapped coils may be more robust than separate coils. Furthermore, center tapped coils may have fewer parasitic capacitances than separate coils. This may have a positive effect on the phase noise and the power consumption of the oscillator.

A center tapped coil includes a first coil element, a second coil element and a center tap. The first coil element and the second coil element are electrically connected to one another, and the center tap is located in the center of this electrical connection. A center tapped coil has a coupling factor K. The coupling factor K is a measure of the extent to which the magnetic flux from the first coil element is picked up by the second coil element.

The inductance 55 includes a coil element 51, a coil element 53 and a center tap 57. The inductance 56 includes a coil element 52, a coil element 54 and a center tap 58. Each coil element has a first terminal and a second terminal. The capacitance 24 also has a first terminal and a second terminal. The first terminals of the coil elements 51, 52 are coupled with one another, and are coupled with a voltage supply node VDD via the reference current source 13. The coil element 51 is connected in series to the coil element 52, and the coil element 53 is connected in parallel to the coil element 54.

The voltage supply node VDD may either be at a constant voltage level, or the voltage supply node VDD may be at a variable voltage level and may be controlled by a control circuit. In addition to the tuning voltage $V_{tune}$ 14, a controllable voltage supply node VDD may be used to control the oscillator circuit.

The reference current source 13 feeds a supply current $I_{core}$ to the voltage control LC oscillator. The supply current $I_{core}$ from the reference current source 13 may be dependent on the supply voltage, which is present at the voltage supply node VDD, so that interference on the supply voltage may affect the supply current $I_{core}$.

Furthermore, a reference current source is generally not completely free of noise and interference. Such noise and interference from the reference current source may also influence the supply current $I_{core}$.

The second terminal of the coil element 51 corresponds to the center tap 57. The center tap 57 is coupled to a tapping point 11, to the first terminal of the capacitance 24, to the first terminal of the coil element 53, to the second terminal of the coil element 54, to a drain terminal of a transistor 31 and to a gate terminal of a transistor 32.

In symmetry to that, the second terminal of the coil element 52 corresponds to the center tap 58. The center tap 58 is coupled with a tapping point 12, to the second terminal of the capacitance 24, to the first terminal of the coil element 54, to the second terminal of the coil element 53, to a drain terminal of the transistor 32 and to a gate terminal of the transistor 31.

A driver circuit 30 is coupled between the tapping points 11, 12 and includes the two cross coupled transistors 31, 32. The cross coupled transistors 31, 32 may be MOS transistors. The cross coupled transistors 31, 32 may be connected to a reference ground potential 33.

Energy that is stored in inductances 55, 56 and in the capacitance 24 may lead to a decaying oscillation, This decaying oscillation, or damping of the oscillation, often occurs as some energy stored in the inductances 55, 56 is converted to heat. The driver circuit 30 may represent a negative resistance, which may compensate for the damping of the LC tank circuit and therefore may prevent damping of the oscillation of the LC tank circuit.

Two signals which have been phase-shifted through 180° are provided at the tapping points 11, 12 and are oscillated at an oscillation frequency $f_{osc}$*. The LC oscillator therefore has a differential output signal that may be tapped off at the tapping points 11, 12. The differential output signal provided at the tapping points 11, 12 may be input signals of circuit parts that are adjacent to the oscillator circuit.

With regard to the arrangement and the values of the components, the LC oscillator is symmetric with respect to the reference ground potential 33 and with respect to the reference current source 13, and is operated in a symmetric way. This may have a positive effect on the natural resonant frequency and on the Q-factor of the LC tank circuit. Furthermore, the symmetric design may improve interference robustness. For example, interference voltages on the tuning voltage $V_{tune}$ 14, interference voltages on the supply voltage, interference from the reference current source 13, interference from the substrate and interference from the atmosphere, inter alia, may be better suppressed.

The reference ground potential 33 may be coupled with a current conductive circuit 40. FIG. 1 shows direct coupling between the reference ground potential 33 and ground.

Figure 2A:
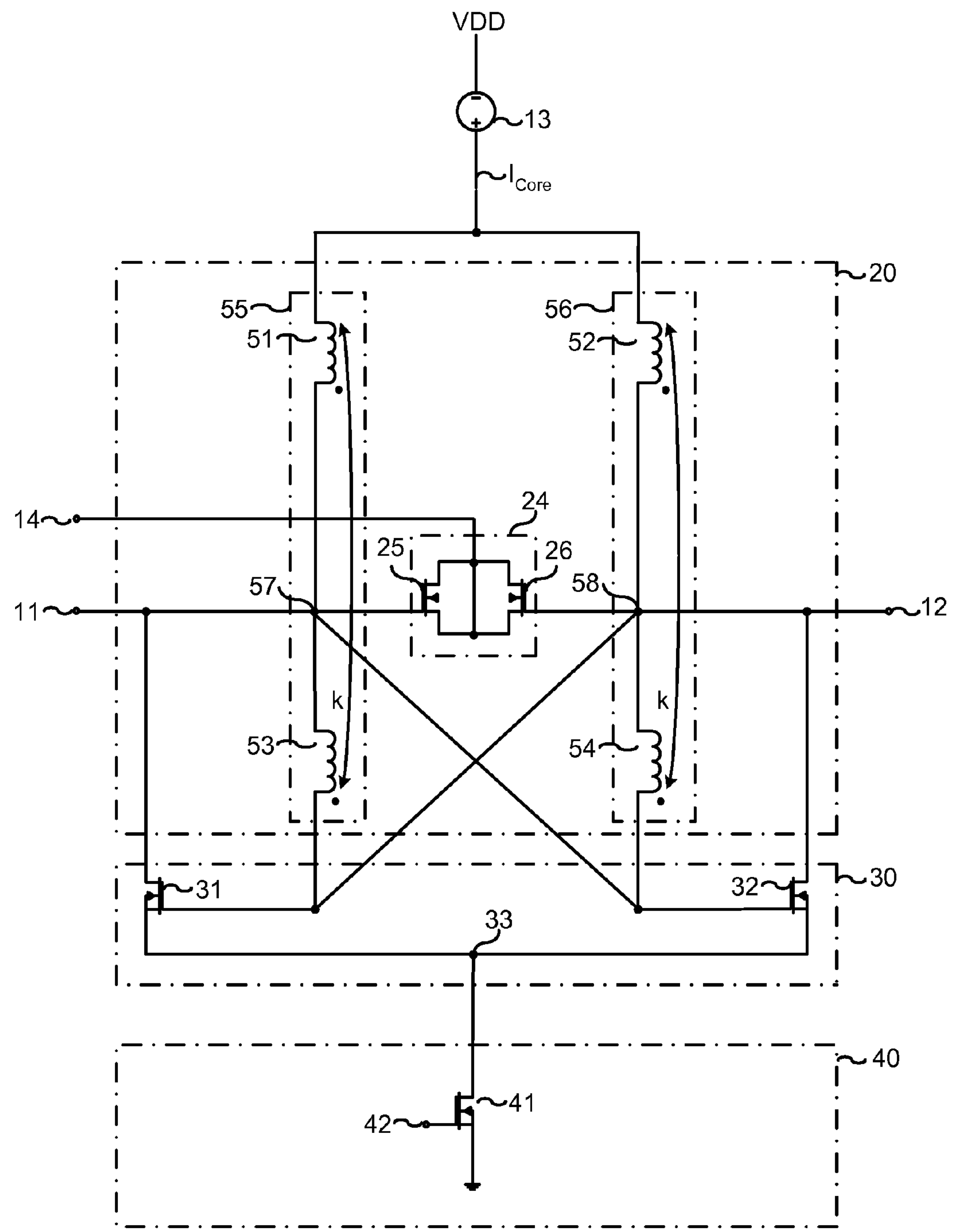
FIG. 2A and FIG. 2B illustrate further schematic circuit diagrams of oscillator circuits.
Figure 2B:
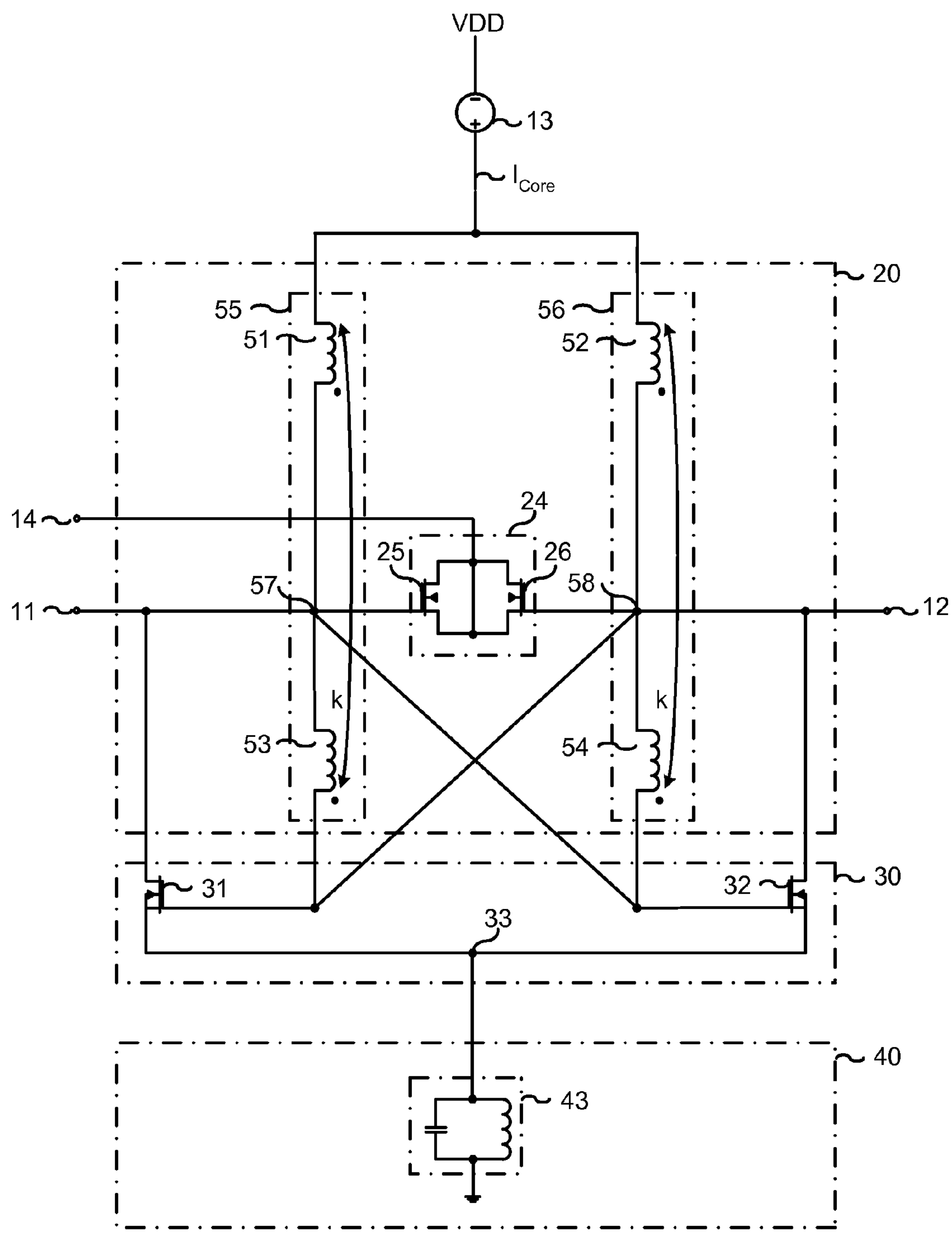

FIG. 2A and FIG. 2B illustrate further schematic circuit diagrams of oscillators and further options for a current conductive circuit. A number of the elements illustrated and numbered in FIGS. 2A and 2B are also illustrated in FIG. 1. For brevity, discussion of a number of those elements is not provided in the following.

FIG. 2A shows a transistor 41 which acts as a current source and couples the reference ground potential 33 with ground. The current may be regulated via the control input 42. In FIG. 2B, the reference ground potential 33 is coupled to ground via a harmonic filter, in the form of an LC tank circuit 43. This circuit may have low phase noise.

The circuit arrangement including center tapped coils may provide a high oscillation frequency and a low power consumption. Furthermore, it may have low phase noise and it may be less susceptible to interference.

Oscillator circuits with low phase noise and low power consumption may be used in conjunction with wireless technologies. Particularly high-frequency VCOs may be used in radar systems associated with motor-vehicle technologies, in clock and data recovery (CDR) circuits, and in phase locked loop (PLL) circuits.

The arrangement of the inductances according to the exemplary implementations illustrated in FIG. 1, FIG. 2A and FIG. 2B may reduce the effective conductance by a factor of 2.5 compared to an oscillator circuit including separate coils. If the two center tapped coils each have a coupling factor k of 0, this results in the oscillation frequency $f_{osc}$* being greater by a factor of 1.6 than the oscillation frequency $f_{osc}$ of an oscillator circuit with separate coils. The power consumption of the circuit arrangement including center tapped coils is in this case the same as the power consumption of the circuit arrangement including separate coils.

An LC oscillator with separate coils has coils with the inductance L and a varactor with the capacitance C, and the oscillation frequency $f_{osc}$ of the LC oscillator is calculated to a good approximation using the following formula from the product of the inductance and capacitance:

$$fosc = \frac{1}{2\pi\sqrt{LC}}$$

The following formula illustrates the increase in frequency of the oscillation frequency $f_{osc}$* of the circuit arrangement including center tapped coils in comparison to the oscillation frequency $f_{osc}$ of the circuit arrangement including separate coils:

$$fosc^* = \frac{1}{2\pi\sqrt{\frac{L}{2.5}C}} = \frac{1}{\frac{2\pi}{1.6}\sqrt{LC}} = 1.6\ fosc$$

Simulation results for the circuit arrangement including center tapped coils, which is designed in a 90 nanometer standard CMOS technology, show that, for a coupling factor k of 0.3, the oscillation frequency is increased by a factor of 2.0 in comparison to the oscillation frequency of a circuit arrangement including separate coils. An oscillation frequency of more than 100 GHz may therefore be achieved. Furthermore, the phase noise is decreased by 5.2 dB in comparison to the phase noise of a circuit arrangement with separate coils. The power consumption of the circuit arrangement including center tapped coils is in this case the same as the power consumption of a circuit arrangement including separate coils.

The oscillator circuit may be designed using both n-MOS transistors and p-MOS transistors, or else using bipolar circuit technology. Furthermore, the oscillator circuit may be used to form a quadrature oscillator circuit, which produces quadrature output signals that have been phase-shifted through 90°. Quadrature output signals may be used for I/Q modulation and I/Q demodulation in the field of cellular radio.

In one implementation, all of the elements of the oscillator circuit may be integrated in a semiconductor component. Integration of all the elements of the oscillator circuit in a semiconductor component allows the oscillator circuit to be manufactured quickly and at low cost. In another implementation, circuit elements, for example inductances, may be entirely or partially external components.

The oscillator circuit may be designed in CMOS technology, and may be produced using a standard technology. The oscillator circuit may be manufactured quickly and at low cost. In one implementation, non-standardized technology options, such as high-resistivity substrate or silicon on insulator (SOI) technology, may be used for the oscillator circuit.

For the purposes of this disclosure and the patent claims that follow, the terms “coupled” and “connected” relate both to direct and indirect connections of circuit elements, that is to say also to connections through intermediate circuits.

What is claimed is:

1. An oscillator circuit, comprising:

an LC tank circuit, including:

a capacitance, a first inductance, and a second inductance, the inductances connected in parallel to the capacitance, the first inductance comprising a first coil element and a second coil element, the second inductance comprising a third coil element and a fourth coil element, the first coil element connected in series with the third coil element, and the second coil element connected in parallel to the fourth coil element, wherein the first inductance and the second inductance are center tapped coils.

2. The oscillator circuit of claim 1, further comprising a driver circuit coupled to the LC tank circuit.

3. The oscillator circuit of claim 2, wherein the driver circuit comprises two cross coupled transistors.

4. The oscillator circuit of claim 2, wherein the coupling between the driver circuit and the LC tank circuit is to provide differential output signals which are 180° phase-shifted and which are to be tapped off at tapping points, wherein the center taps of the coils being coupled to one of the tapping points.

5. The oscillator circuit of claim 1, wherein a first center tap is coupled to a first terminal of the capacitance, and a second center tap is coupled to a second terminal of the capacitance.

6. The oscillator circuit of claim 1, wherein the oscillator circuit is a voltage controlled oscillator, wherein the capacitance is a varactor controlled by a tuning voltage.

7. The oscillator circuit of claim 6, wherein the tuning voltage to be adjusted in discrete steps.

8. The oscillator circuit of claim 6, wherein the tuning voltage to be adjusted in an analog manner.

9. The oscillator circuit of claim 1, wherein the oscillator circuit is symmetrical.

10. The oscillator circuit of claim 1, wherein the oscillator circuit is integrated in a semiconductor component.

11. The oscillator circuit of claim 1, wherein the oscillator circuit is designed in a CMOS technology.

* * * * *